INVENTORS S. R. ARNOLD
R. EDWARDS
R. L. PRITCHETT
BY H. W. Lockhart
ATTORNEY

FIG. 2
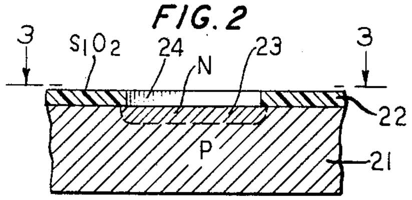
FIG. 3
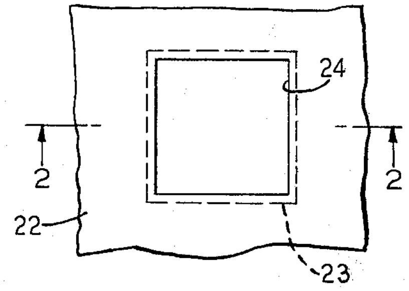
FIG. 4
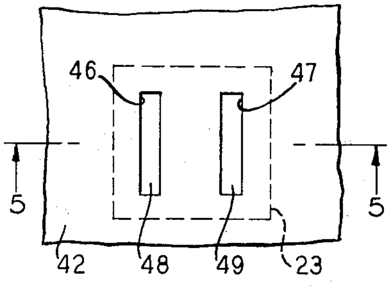
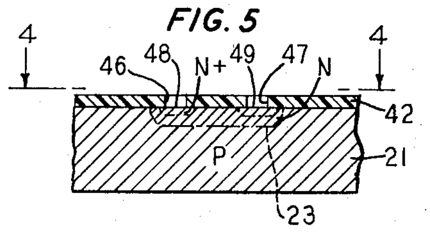
FIG. 6
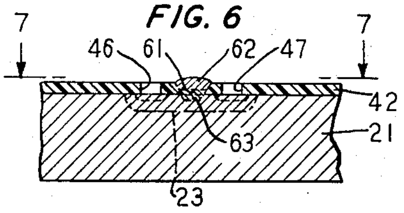
FIG. 7
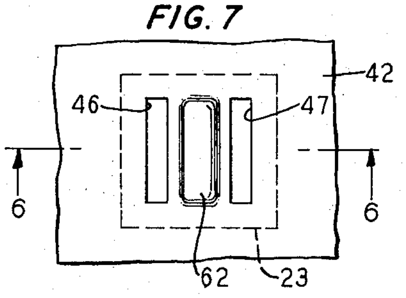
FIG. 8
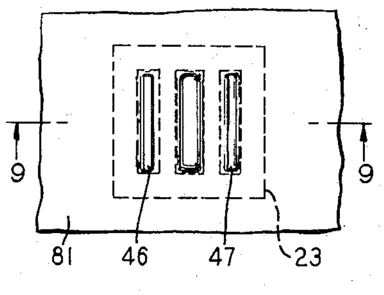
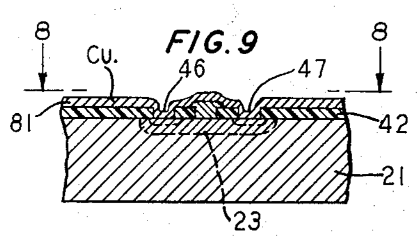
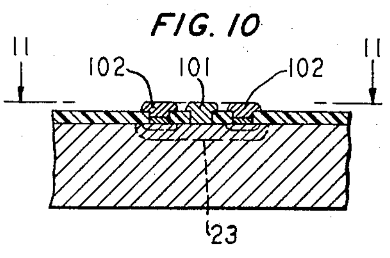
FIG. 11
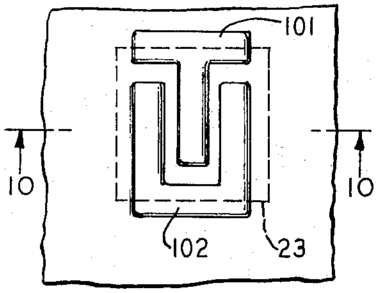

3,408,733

LOW RESISTANCE CONTACT TO DIFFUSED JUNCTION GERMANIUM TRANSISTOR

Stephen R. Arnold, North Plainfield, Roger Edwards, Gillette, and Robert L. Pritchett, Plainfield, N.J., assignors to Bell Telephone Laboratories, Incorporated, New York, N.Y., a corporation of New York Filed Mar. 22, 1966, Ser. No. 536,345
2 Claims. (Cl. 29—590)

ABSTRACT OF THE DISCLOSURE

A low resistance contact to very shallow diffused base layers in planar germanium transistors is made by sintering a thin layer of copper to the surface of the base layer. A uniform intimate bond with limited penetration results from the formation of an intermetallic compound of copper germanide. The contact is then built up to improve the current carrying capacity by further metal deposition, such as successive layers of titanium or chromium and aluminum.

Figure 1:
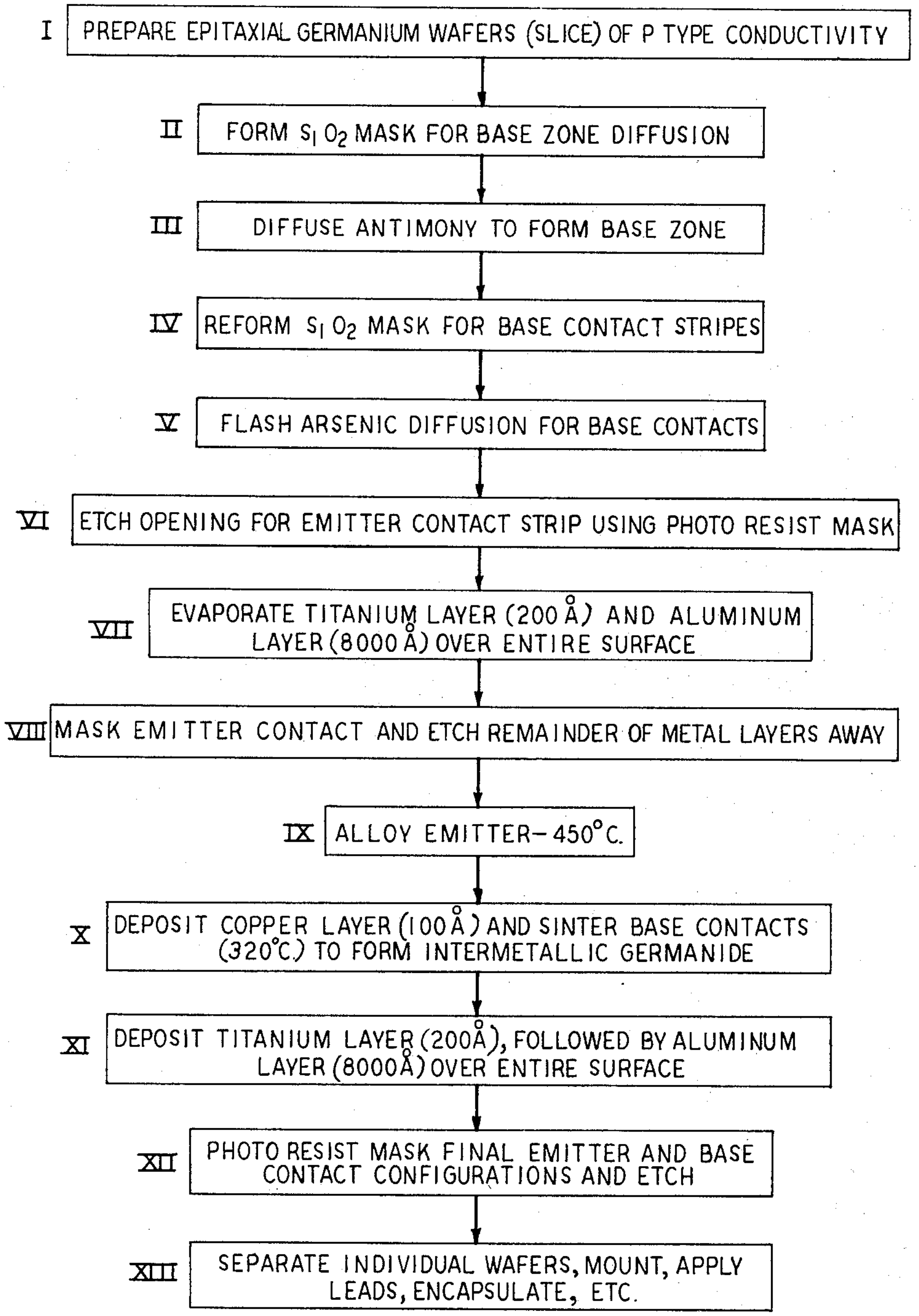

This invention relates to semiconductor devices and more particularly to the fabrication of improved low resistance contacts to germanium semiconductor devices.

With the application of planar techniques to germanium semiconductor devices improvements are realized both in power handling capability and frequency repsonse. For improved frequency response in particular, extremely thin emitter and base zones are necessary for germanium transistors. The problem then arises of making low resistance contact to such thin regions without penetrating and destroying the zone while at the same time achieving the low resistance consistent with high frequency response.

Moreover, not only must the contact have extremely low series resistance so as not to degrade electrical characteristics but the contact must withstand subsequent device fabrication steps, in particular the heat cycling used for lead attachment and wafer bonding.

In accordance with this invention a thin initial film of copper is sintered to the surface of a shallow diffused zone to provide the basis of an improved low resistance contact.

Accordingly an object of this invention is an improved germanium transistor.

A further object is a planar germanium transistor having very low resistance contacts.

In accordance with this invention an initial thin film of copper having a thickness of 100 to 200 Angstroms is sintered at a temperature of about 300 degrees centigrade for a brief period to form an intermetallic germanide at the surface of a diffused zone in a semiconductor body. An intermediate metallic layer having a thickness of a few hundred Angstroms then is deposited using titanium or chromium which separates the copper compound from an overlying layer of aluminum of considerably greater thickness. This contact structure is compatible with the heat treatments attendant to thermocompression lead bonding operations and with the reagents employed for etching and masking operations.

The invention and its further objects and features will be more clearly understood from the following detailed description taken in conjunction with the drawing in which:

FIG. 1 is a flow chart setting forth the steps in the fabrication of contacts to a germanium transistor in accordance with this invention; and FIG. 2 through FIG. 11 show a series of sectional and plan views of a transistor element at various stages of the process as set forth in FIG. 1. Each of the figures numbered 2 through 11 is a sectional view of the figure carying the section-line numbers thereof and arrows taken along the plane thus indicated.

Referring to the flow chart of FIG. 1 this description of the fabrication process begins with a slice of germanium semiconductor material having a surface portion, not shown, produced epitaxially by vapor deposition. From this slice a plurality, possibly several hundred, individual transistor elements will be fabricated. Accordingly, the following described process, although in terms of a single element, will be understood to be performed upon an entire slice which subsequently will be divided into separate elements.

Following the preparation of the material as indicated in step I of FIG. 1 an oxide mask is formed as described in step II on the epitaxial surface of the body which defines the area of the base zone diffusion. Referring to FIGS. 2 and 3, the silicon oxide mask 22 on germanium is formed by the pyrolytic decomposition of an organic silane. A photoresist and etching operation forms the desired diffusion window 24. The N type base zone 23 is formed by the inward diffusion of antimony and the zone 23 has a depth of about 0.3 micron.

Following the diffusion process of step III the oxide mask is reformed as indicated in step IV and a pair of rectangular openings 46 and 47 as shown in FIGS. 4 and 5, are made to delineate the base contacts. Then as set forth, in step V a flash diffusion of arsenic produces shallow zones 48 and 49 of low resistivity (N+) conductivity, in the semiconductor material adjoining these openings.

Following this diffusion, a central rectangular opening for the emitter connection is fabricated as shown in FIGS. 6 and 7. As recited in step VI this is accomplished by means of a photoresist and etching step. Next, referring to step VII a thin layer 61 of titanium is deposited over the entire surface followed by deposition of a heavier layer 62 of aluminum. Typically the titanium layer 61 has a thickness of about 200 Angstroms and the aluminum layer 62 aproximately 8000 Angstroms.

A mask is then provided over the emitter contact area and the exposed aluminum and titanium is removed using a suitable etchant. After this step VIII the element appears as shown in FIGS. 6 and 7. Referring to step IX, the body then is heated at about 425 degrees centigrade for a period of about five minutes which alloys the aluminum-titanium layer 61–62 into the adjoining N type germanium zone to produce a shallow zone 63 of P type conductivity which constitutes the emitter zone. In this instance the aluminum functions as an acceptor to produce the P type emitter zone 63.

In the next operation, described in step X of FIG. 1 and as depicted in FIGS. 8 and 9, a thin layer 81 of copper is deposited over the entire surface of the body. Typically, this layer has a thickness of from about 100 to about 200 Angstroms and is deposited by conventional techniques such as cathodic sputtering or vacuum evaporation. The thickness of the layer may be controlled by visual observation of coloration or by empirical methods. As indicated in FIGS. 8 and 9 the copper layer 81 contacts the degenerate base zones 46 and 47 within the area of the base contact windows 46 and 47.

Next the body is heated at a temperature of from about 300 to 320 degrees centigrade for a period of several minutes, for example, about ten. This temperature is below the melting point not only of both copper and germanium but of the lowest melting alloy of these two elements. The effect of the heat treatment is to produce a solid phase reaction between copper and germanium thereby forming an intermetallic compound, referred to as copper germanide. The heat treatment is selected to enable reaction of substantially all of the copper deposited on the germanium surface. The formation of this intermetallic compound is an important aspect of the fabrication of a low resistance contact in accordance with this invention. This step provides ohmic contact to the shallow diffused germanium zone without undue depth penetration, and results in a relatively fixed and stable contact structure.

In accordance with step XI of FIG. 1 a slightly thicker layer of titanium or chromium is deposited over the copper layer. This intermediate layer is followed by a heavier aluminum layer likewise over the entire surface of the body. The intermediate layer of titanium or chromium is important as a separating barrier to inhibit reaction between the aluminum and underlying copper germanide or germanium. The overlying layer of aluminum is important for facilitating external connection to the semiconductor device.

Then, as described in step XII a photoresist mask is formed on the surface of the body defining the contact configurations 101 and 102 for the emitter and base and particularly as shown in FIG. 10 and FIG. 11. Using a suitable etchant the contacts are etched out as shown with the large area portions provided for easy bonding of external wire leads. As can be seen, these contacts in part overlie the oxide layer 22.

Finally, steps which are conventional and well known in the art are used to divide the slice into the individual wafers which then are mounted and provided with external wire leads and suitable encapsulations. As indicated previously this subsequent fabrication involving heating operations to bond leads and to provide suitable closures may be done without jeopardizing the shallow diffused zones of this type of high frequency transistor. For example, responses in the 12 gigacycle range are standard for transistors fabricated in accordance with this invention.

Although the invention has been described in accordance with a specific embodiment, it will be understood that variations may be devised by those skilled in the art which likewise will fall within the scope and spirit of the invention.

What is claimed is:

1. In the fabrication of a planar germanium transistor the method of making a low resistance contact to a shallow diffused zone of N-type conductivity in a body of germanium semiconductor material comprising defining the contact area on the surface of said zone, depositing a thin layer of copper on said contact area, heating the body at a temperature and for a time sufficient to cause substantially all of said copper to react with said germanium to form a copper germanide, said temperature being below the melting point of both copper and germanium and the melting point of the lowest melting alloy of copper and germanium, and depositing on said copper germanide a metallic overlayer to serve as an electrode.

2. In the fabrication of a planar germanium transistor the method of making a low resistance contact to a shallow diffused conductivity type zone in a body of germanium semiconductor material comprising defining the contact area on the surface of said zone, depositing a copper layer having a thickness of from about 100 to 200 Angstroms on said contact area, heating the body at a temperature from about 300 to 320 degrees centigrade for a time sufficient to cause substantially all of said copper to react with said germanium to form a copper germanide, and depositing on said copper germanide a metallic overlayer to serve as an electrode.

References Cited

UNITED STATES PATENTS

| | | | |
|---|---|---|---|
| 2,875,505 | 3/1959 | Pfann | 29—578 |
| 2,981,877 | 4/1961 | Noyce. | |
| 3,287,612 | 11/1966 | Lepselter | 29—578 X |
| 3,333,324 | 8/1967 | Roswell et al. | 29—497.5 |

WILLIAM I. BROOKS, *Primary Examiner.*